United States Patent
Choi et al.

(10) Patent No.: US 8,460,966 B2
(45) Date of Patent: Jun. 11, 2013

(54) THIN FILM TRANSISTOR AND METHOD FOR FABRICATING THIN FILM TRANSISTOR

(75) Inventors: Sung Hwan Choi, Seoul (KR); Min Koo Han, Seoul (KR)

(73) Assignee: Snu R&DB Foundation, Seoul (KR)

( * ) Notice: Subject to any disclaimer, the term of this patent is extended or adjusted under 35 U.S.C. 154(b) by 99 days.

(21) Appl. No.: 13/181,995

(22) Filed: Jul. 13, 2011

(65) Prior Publication Data
US 2012/0018721 A1  Jan. 26, 2012

(30) Foreign Application Priority Data
Jul. 26, 2010  (KR) .................. 10-2010-0072133

(51) Int. Cl.
*H01L 21/44* (2006.01)
*H01L 29/24* (2006.01)
(52) U.S. Cl.
USPC ............. 438/104; 438/149; 438/151; 257/43; 257/E21.461; 257/E21.476; 257/E29.101
(58) Field of Classification Search
USPC ............................................ 438/104; 257/43
See application file for complete search history.

(56) References Cited

U.S. PATENT DOCUMENTS

| | | |
|---|---|---|
| 6,107,640 A | 8/2000 | Park et al. |
| 2006/0110939 A1* | 5/2006 | Joshi et al. .................. 438/778 |
| 2006/0220034 A1* | 10/2006 | Yin et al. ....................... 257/79 |
| 2010/0127266 A1* | 5/2010 | Saito et al. ..................... 257/59 |
| 2010/0163862 A1* | 7/2010 | Yang et al. ..................... 257/43 |
| 2011/0140115 A1* | 6/2011 | Ahn ............................... 257/59 |

FOREIGN PATENT DOCUMENTS

| | | |
|---|---|---|
| JP | 10-93102 | 4/1998 |
| KR | 2002-0067744 | 8/2002 |

* cited by examiner

*Primary Examiner* — Angel Roman

(57) ABSTRACT

A thin film transistor, which has a first passivation layer and a second passivation layer to maintain high reliability while preventing hydrogen from being induced to a semiconductor layer, and a method for fabricating the thin film transistor are provided. The method includes providing a substrate including an insulation substrate, forming a gate electrode on the substrate, forming a gate insulation layer on the substrate and the gate electrode, forming a semiconductor layer on the gate insulation layer, forming source/drain electrodes on the semiconductor layer to expose a portion of a top portion of the semiconductor layer, forming a first passivation layer to cover exposed top portions of the gate insulation layer, the semiconductor layer and the source/drain electrodes, and forming a second passivation layer on the first passivation layer, wherein the forming of the second passivation layer comprises performing deposition at a higher temperature than the forming of the first passivation layer.

20 Claims, 14 Drawing Sheets

THIN FILM TRANSISTOR AND METHOD FOR FABRICATING THIN FILM TRANSISTOR

CROSS-REFERENCE TO RELATED APPLICATION

This application claims priority to and the benefit of Korean Patent Application No. 10-2010-0072133 filed on Jul. 26, 2010, which is herein incorporated by reference in its entirety.

BACKGROUND OF THE INVENTION

1. Field of the Invention

The present invention relates generally to a thin film transistor and a method for fabricating the thin film transistor.

2. Description of the Related Art

In general, a thin film transistor (TFT) is used as an active element of a liquid crystal display device. The TFT generally includes a semiconductor layer, a gate electrode, a source electrode and a drain electrode. In the TFT, a passivation layer has conventionally been deposited on exposed surfaces of the semiconductor layer, the source electrode and the drain electrode to protect the semiconductor layer that is externally exposed. However, depositing of the passivation layer may deteriorate performance of the semiconductor layer or lower the reliability of the TFT.

SUMMARY OF THE INVENTION

The present invention is intended to overcome the above-described problems of the related art, and aspects of the present invention provides a thin film transistor (TFT) which has a first passivation layer and a second passivation layer to maintain high reliability while preventing hydrogen from being induced to a semiconductor layer, and a method for fabricating the thin film transistor.

To achieve the above-described aspects, a method for fabricating a thin film transistor is provided, including providing a substrate including an insulation substrate, forming a gate electrode on the substrate, forming a gate insulation layer on the substrate and the gate electrode, forming a semiconductor layer on the gate insulation layer, forming source/drain electrodes on the semiconductor layer to expose a portion of a top portion of the semiconductor layer, forming a first passivation layer to cover exposed top portions of the gate insulation layer, the semiconductor layer and the source/drain electrodes, and forming a second passivation layer on the first passivation layer, wherein the forming of the second passivation layer comprises performing deposition at a higher temperature than the forming of the first passivation layer.

Here, the semiconductor layer may be an amorphous IGZO semiconductor layer formed by doping indium (In) and gallium (Ga) into a zinc oxide (ZnO).

The forming of the first passivation layer may include depositing the first passivation layer by inductively coupled plasma-chemical vapor deposition (ICP-CVD). In addition, the forming of the second passivation layer may include depositing the second passivation layer by inductively coupled plasma-chemical vapor deposition (ICP-CVD).

In addition, the forming of the first passivation layer may be performed at a processing temperature in a range of 120° C. to 170° C. Preferably, the forming of the first passivation layer is performed at a processing temperature of 150° C.

In addition, the forming of the second passivation layer may be performed at a processing temperature in a range of 280° C. to 320° C. Preferably, the forming of the second passivation layer is performed at a processing temperature of 300° C.

To achieve the above-described aspects, a method for fabricating a thin film transistor is also provided, including providing a substrate including an insulation substrate, forming a gate electrode on the substrate, forming a gate insulation layer on the substrate and the gate electrode, forming a semiconductor layer on the gate insulation layer, forming a first passivation layer on the semiconductor layer to be located corresponding to the gate insulation layer, forming source/drain electrodes on the semiconductor layer and the gate insulation layer to expose a portion of a top portion of the first passivation layer, and forming a second passivation layer to cover exposed top portions of the semiconductor layer, the source/drain electrodes and the first passivation layer, and wherein the forming of the second passivation layer comprises performing deposition at a higher temperature than the forming of the first passivation layer.

Here, the semiconductor layer may be an amorphous IGZO semiconductor layer formed by doping indium (In) and gallium (Ga) into a zinc oxide (ZnO).

The forming of the first passivation layer may include depositing the first passivation layer by inductively coupled plasma-chemical vapor deposition (ICP-CVD). In addition, the forming of the second passivation layer may include depositing the second passivation layer by inductively coupled plasma-chemical vapor deposition (ICP-CVD). In addition, the forming of the first passivation layer may be performed at a processing temperature in a range of 120° C. to 170° C. Preferably, the forming of the first passivation layer is performed at a processing temperature of 150° C.

In addition, the forming of the second passivation layer may be performed at a processing temperature in a range of 280° C. to 320° ° C. Preferably, the forming of the second passivation layer is performed at a processing temperature of 300° ° C.

To achieve the above-described aspects, a thin film transistor is also provided, including a substrate made of an insulating material, a gate electrode formed on the substrate, a gate insulation layer formed on the substrate and the gate electrode, a semiconductor layer formed on the gate insulation layer to be located corresponding to the gate electrode, source/drain electrodes formed to expose a portion of a top portion of the semiconductor layer, a first passivation layer to cover exposed portions of the gate insulation layer, the semiconductor layer and the source/drain electrodes, and a second passivation layer formed to cover a top portion of the first passivation layer, wherein the second passivation layer is formed by deposition performed at a higher temperature than the first passivation layer Here, the semiconductor layer may be an amorphous IGZO semiconductor layer formed by doping indium (In) and gallium (Ga) into a zinc oxide (ZnO).

To achieve the above-described aspects, a thin film transistor is also provided, including a substrate made of an insulating material, a gate electrode formed on the substrate, a gate insulation layer formed on the substrate and the gate electrode, a semiconductor layer formed on the gate insulation layer to be located corresponding to the gate electrode, a first passivation layer formed on the semiconductor layer to be located corresponding to the gate insulation layer, source/drain electrodes formed to expose a portion of a top portion of the semiconductor layer, and a second passivation layer formed to cover a top portion of the first passivation layer, wherein the second passivation layer is formed by deposition performed at a higher temperature than the first passivation layer Here, the semiconductor layer may be an amorphous IGZO semiconductor layer formed by doping indium (In) and gallium (Ga) into a zinc oxide (ZnO).

As described above, in the method for fabricating the thin film transistor according to the aspect of the present invention, a first passivation layer is formed under a processing condition of a relatively low temperature, thereby preventing hydrogen from being induced to a semiconductor layer, specifically a semiconductor layer made of an IGZO material.

In addition, in the method for fabricating the thin film transistor according to the aspect of the present invention, a second passivation layer is deposited on a first passivation layer under the processing condition of a relatively high temperature, thereby improving the reliability of the thin film transistor.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a method for fabricating a thin film transistor according to an embodiment of the present invention will be described.

Figure 1:
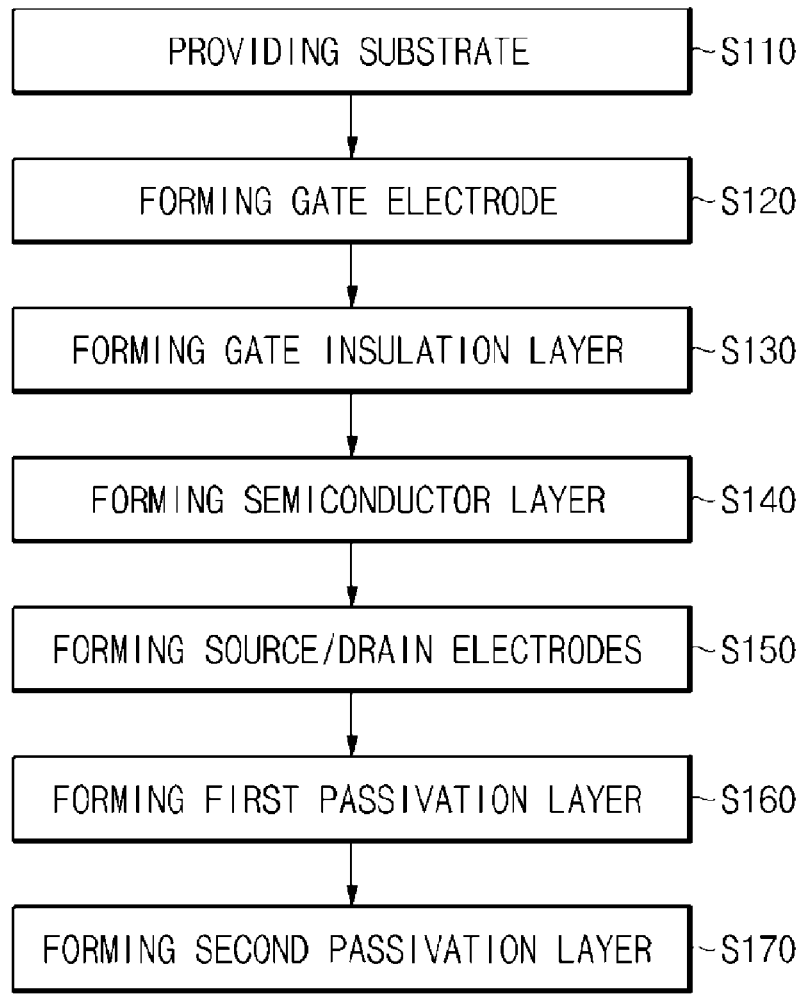
FIG. 1 is a flowchart illustrating a method for fabricating a thin film transistor according to an embodiment of the present invention.

FIG. 1 is a flowchart illustrating a method for fabricating a thin film transistor according to an embodiment of the present invention, and FIGS. 2A to 2G are cross-sectional views illustrating a method for fabricating a thin film transistor according to an embodiment of the present invention.

The method for fabricating a thin film transistor according to an embodiment of the present invention includes providing a substrate (S110), forming a gate electrode (S120), forming a gate insulation layer (S130), forming a semiconductor layer (S140), forming source/drain electrodes (S150), forming a first passivation layer (S160) and forming a second passivation layer (S170).

Figure 2A:
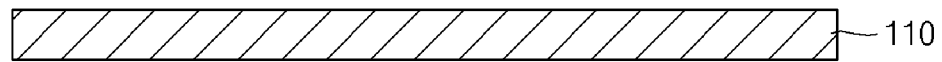
FIGS. 2A to 2G are cross-sectional views illustrating a method for fabricating a thin film transistor according to an embodiment of the present invention.

Referring to FIGS. 1 and 2A, in the providing of the substrate (S110), an insulating substrate 110 is provided. The substrate 110 may be made of glass or plastic, but the invention does not limit the material of the substrate 110 thereto.

Figure 2B:
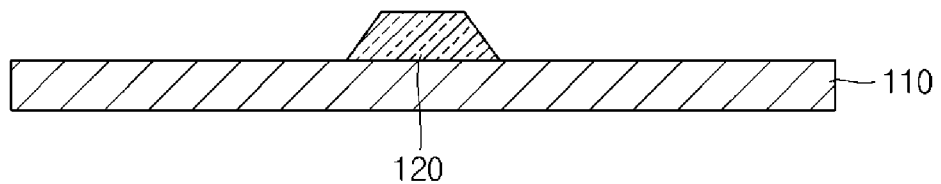

Referring to FIGS. 1 and 2B, in the forming of the gate electrode (S120), a gate electrode 120 is formed on the substrate 110. The gate electrode 120 is formed by patterning a predetermined portion of a top portion of the substrate 110. The gate electrode 120 may be made of any one metal selected from the group consisting of aluminum, an aluminum alloy, molybdenum, a molybdenum alloy, and chrome. It should be noted that the listing of the above materials should not be seen as to limit the scope of the present invention. Other materials may be used without departing from the spirit and scope of the present invention.

Figure 2C:
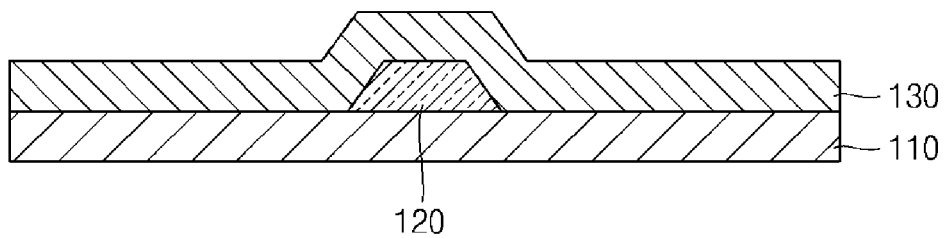

Referring to FIGS. 1 and 2C, in the forming of the gate insulation layer (S130), a gate insulation layer 130 is deposited on the substrate 110 and the gate electrode 120. The gate insulation layer 130 may be formed of a single layer or multiple layers of more than one layers, including at least one having excellent heat transmitting and electrically insulating characteristics, selected from the group consisting of a silicon oxide layer, a silicon nitride layer, a diamond like carbon (DLC) layer, and a silicon carbonaceous layer. However, the present invention is not limited to such materials. In addition, the gate insulation layer 130 may be formed by chemical vapor deposition (CVD).

Figure 2D:
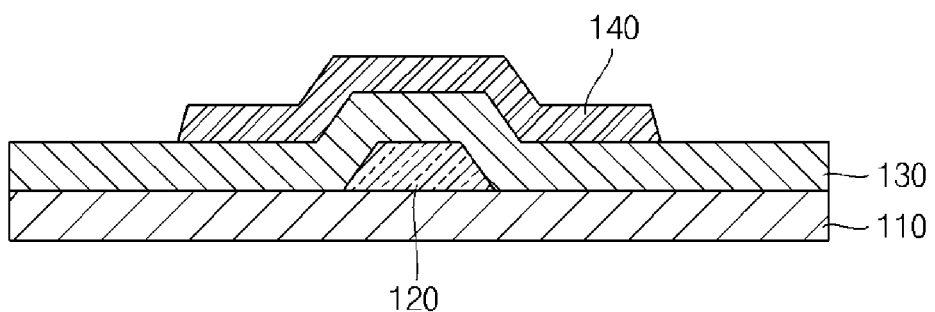

Referring to FIGS. 1 and 2D, in the forming of the semiconductor layer (S140), a semiconductor layer 140 is deposited on the gate insulation layer 130 to be located corresponding to the gate electrode 120. The semiconductor layer 140 may be an oxide semiconductor layer. In detail, the semiconductor layer 140 may be an amorphous IGZO semiconductor layer formed by doping indium (In) and gallium (Ga) into a zinc oxide (ZnO). The amorphous IGZO semiconductor layer exhibits high uniformity, improved material stability due to addition of gallium (Ga), and an improved electrical property due to addition of indium (In). In addition, the amorphous IGZO semiconductor layer has high mobility and good chemical resistance. Additionally, the semiconductor layer 140 may be an amorphous silicon-based, a polysilicon-based or an organic thin film substrate semiconductor. However, the present invention is not limited to such materials. Further, the semiconductor layer 140 may be deposited on the gate insulation layer 130 by CVD or physical vapor deposition (PVD). It should be noted that the method for forming the semiconductor layer 140 is not limited to the above mentioned methods.

Figure 2E:
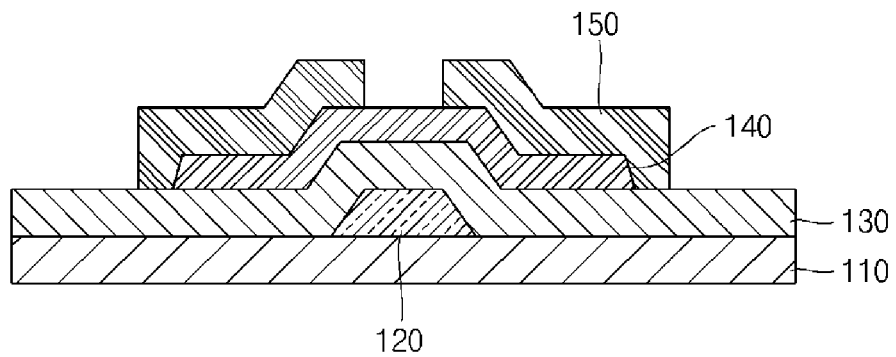

Referring to FIGS. 1 and 2E, in the forming of the source/drain electrodes (S150), source/drain electrodes 150 are formed on the semiconductor layer 140 to expose a portion of a top portion of the semiconductor layer 140.

Figure 2F:
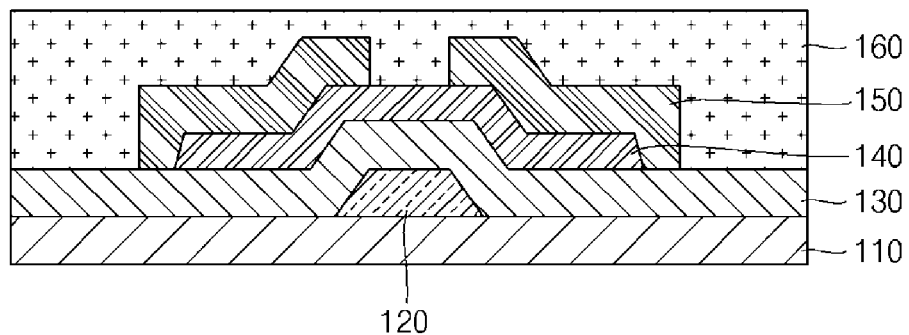

Referring to FIGS. 1 and 2F, in the forming of the first passivation layer (S160), a first passivation layer 160 is formed to cover exposed top portions of the gate insulation layer 130, the semiconductor layer 140 and the source/drain electrodes 150. The first passivation layer 160 may be formed of a silicon oxide ($SiO_x$) layer. However, the present invention is not limited to such material. In addition, the first passivation layer 160 may be deposited on the gate insulation layer 130, the semiconductor layer 140 and the source/drain electrode 150 by inductively coupled plasma-chemical vapor deposition (ICP-CVD). The ICP-CVD activates gas decomposition even at a low temperature by generating high density plasma. In addition, since the ICP-CVD employs remote plasma, a plasma generating zone and a substrate are spaced apart from each other, thereby reducing ion damages to a plasma-based film-growth zone. The ICP-CVD may be performed using $SiH_4$, $N_2O$ or He gas as a reaction gas. However, the present invention is not limited to such materials. The forming of the first passivation layer (S160), that is, the ICP-CVD, may be performed at a processing temperature in a range of 120° C. to 170° C. If the processing temperature of the ICP-CVD in the forming of the first passivation layer (S160) is lower than 120° C., the first passivation layer 160 may not be deposited densely due to low temperature processing conditions and the reliability of the first passivation layer 160 may be deteriorated. If the processing temperature of the ICP-CVD in the forming of the first passivation layer (S160) is higher than 170° C., hydrogen may be induced to the IGZO semiconductor layer 140 due to high temperature deposition while depositing the first passivation layer 160 on the semiconductor layer 140. In such a case, the semiconductor layer 140 may have conductivity, which disables the semiconductor layer 140 to serve as a TFT. The ICP-CVD in the forming of the first passivation layer (S160) is preferably performed at a processing temperature of 150° C. When the forming of the second passivation layer (S170), which will later be described, is performed at a processing temperature of 300° C., the processing temperature of 150° C. may be the optimum temperature for the forming of the first passivation layer (S160), which will later be described with regard to an exemplary embodiment.

Figure 2G:
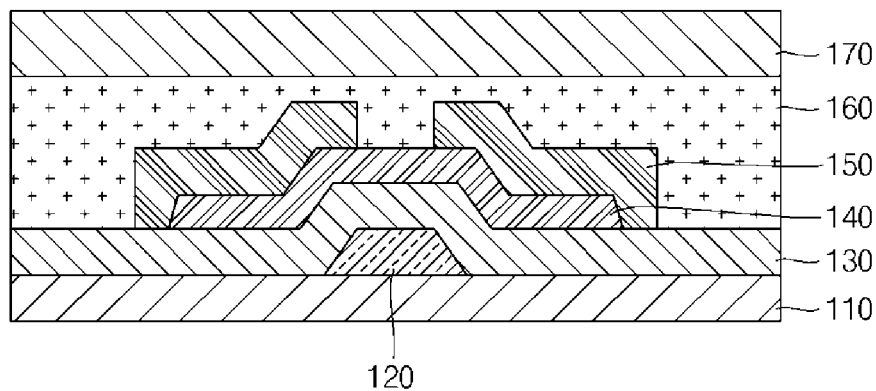

Referring to FIGS. 1 and 2G, in the forming of the second passivation layer (S170), a second passivation layer 170 is formed on the first passivation layer 160. The second passivation layer 170 may be deposited on the first passivation layer 160 by ICP-CVD. In addition, the second passivation layer 170 may be deposited on the first passivation layer 160 by CVD or PVD. However, it should be noted that the method for forming the second passivation layer 170 is not limited to the above mentioned methods. The second passivation layer 170 may be a single layer formed of at least one selected from the group consisting of a silicon oxide layer, a silicon nitride layer, a diamond like carbon (DLC) layer, and a silicon carbonaceous layer. However, the present invention is not limited to such materials. The forming of the second passivation layer (S170) may be performed at a processing temperature in a range of 280° C. to 320° °C. If the processing temperature of the forming of the second passivation layer (S170) is lower than 280° °C., the second passivation layer 170 may not be deposited densely. That is to say, the effect of improving the reliability of the TFT 100 by depositing the second passivation layer 170 at a higher temperature than the first passivation layer 160 may be reduced. If the processing temperature of the forming of the second passivation layer (S170) is higher than 320° °C., the semiconductor layer 140 or the substrate 110 made of a flexible plastic material may be damaged due to a high temperature process. The forming of the second passivation layer (S170) is preferably performed at a processing temperature of 300° °C. If the forming of the first passivation layer (S160) is performed at a processing temperature of 150° °C., the forming of the second passivation layer (S170) may be performed at 300° C.

Hereinafter, a method for fabricating a thin film transistor according to another embodiment of the present invention will be described.

Figure 3:
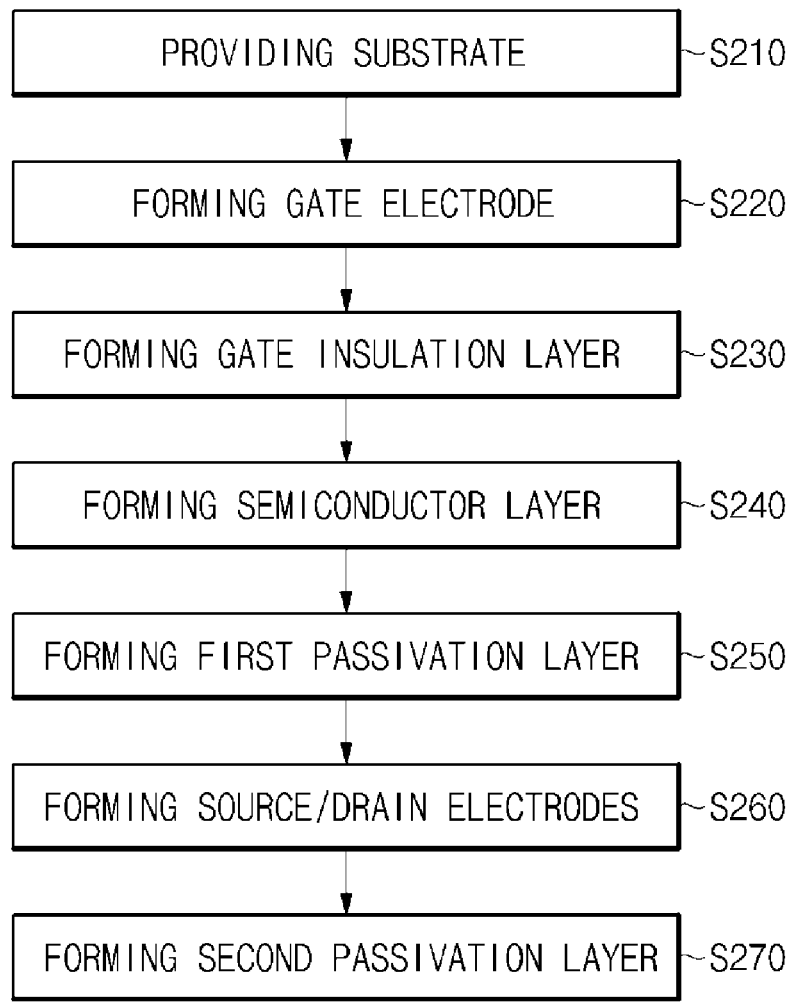
FIG. 3 is a flowchart illustrating a method for fabricating a thin film transistor according to another embodiment of the present invention.

FIG. 3 is a flowchart illustrating a method for fabricating a thin film transistor according to another embodiment of the present invention, and FIGS. 4A to 4G are cross-sectional views illustrating a method for fabricating a thin film transistor according to another embodiment of the present invention.

The method for fabricating a thin film transistor according to another embodiment of the present invention includes providing a substrate (S210), forming a gate electrode (S220), forming a gate insulation layer (S230), forming a semiconductor layer (S240), forming a first passivation layer (S250), forming source/drain electrodes (S260) and forming a second passivation layer (S270).

Figure 4A:
FIGS. 4A to 4G are cross-sectional views illustrating a method for fabricating a thin film transistor according to another embodiment of the present invention.

Referring to FIGS. 3 and 4A, in the providing of the substrate (S210), an insulating substrate 210 is provided. The substrate 210 may be made of glass or plastic, but the present invention does not limit the material of the substrate 210 thereto.

Figure 4B:
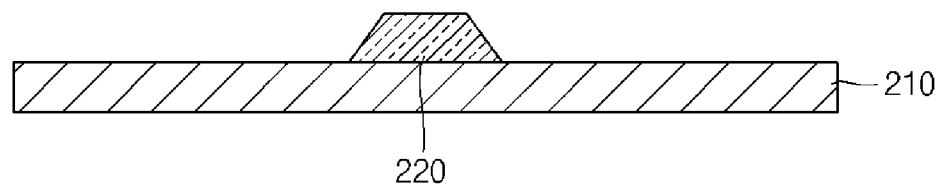

Referring to FIGS. 3 and 4B, in the forming of the gate electrode (S220), a gate electrode 220 is formed on the substrate 210. The gate electrode 220 is formed by patterning a predetermined portion of a top portion of the substrate 210. The gate electrode 220 may be made of any one metal selected from the group consisting of aluminum, an aluminum alloy, molybdenum, a molybdenum alloy, and chrome. However, the present invention is not limited to such materials.

Figure 4C:
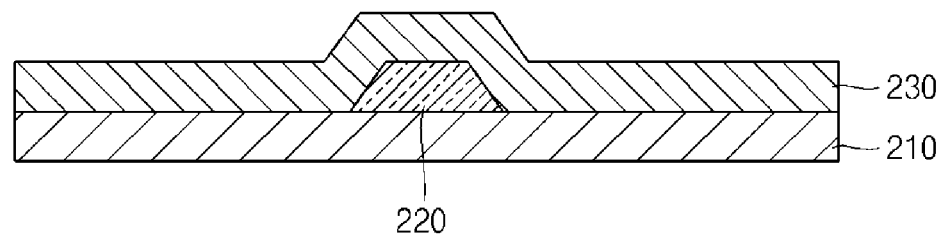

Referring to FIGS. 3 and 4C, in the forming of the gate insulation layer (S230), a gate insulation layer 230 is deposited on the substrate 210 and the gate electrode 220. The gate insulation layer 230 may be formed of a single layer or multiple layers of more than one layers, including at least one having excellent heat transmitting and electrically insulating characteristics, selected from the group consisting of a silicon oxide layer, a silicon nitride layer, a diamond like carbon (DLC) layer, and a silicon carbonaceous layer. However, the present invention is not limited to such materials. In addition, the gate insulation layer 230 may be formed by chemical vapor deposition (CVD). However, it should be noted that the method for forming the gate insulation layer 230 is not limited to the above mentioned method.

Figure 4D:
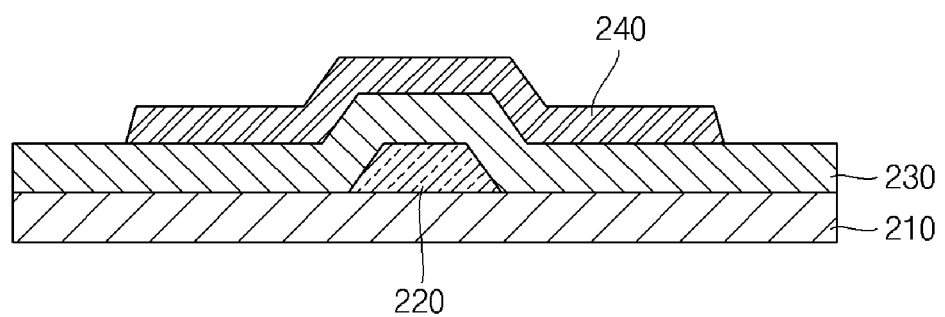

Referring to FIGS. 3 and 4D, in the forming of the semiconductor layer (S240), a semiconductor layer 240 is deposited on the gate insulation layer 230 to be located corresponding to the gate electrode 220. The semiconductor layer 240 may be an oxide semiconductor layer. In detail, the semiconductor layer 240 may be an amorphous IGZO semiconductor layer formed by doping indium (In) and gallium (Ga) into a zinc oxide (ZnO). The amorphous IGZO semiconductor layer exhibits high uniformity, improved material stability due to addition of gallium (Ga), and an improved electrical property due to addition of indium (In). In addition, the amorphous IGZO semiconductor layer has high mobility and good chemical resistance. Additionally, the semiconductor layer 240 may be an amorphous silicon-based, a polysilicon-based or an organic thin film substrate semiconductor. However, the present invention is not limited to such materials. Further, the semiconductor layer 240 may be deposited on the gate insulation layer 230 by CVD or physical vapor deposition (PVD). However, it should be noted that the method for forming the semiconductor layer 240 is not limited to the above mentioned methods.

Figure 4E:
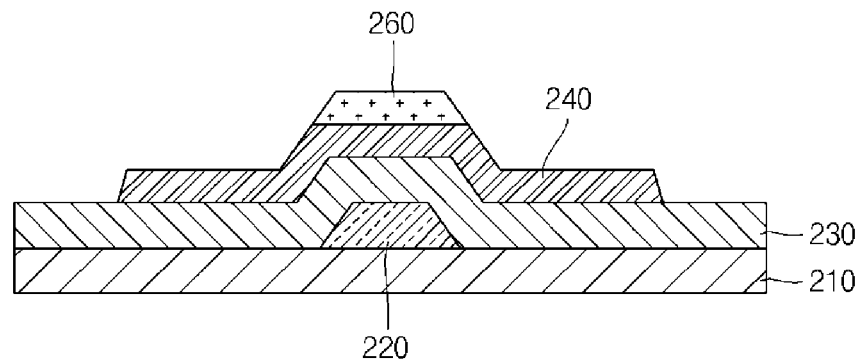

Referring to FIGS. 3 and 4E, in the forming of the first passivation layer (S250), a first passivation layer 260 is formed at a location corresponding to a location of the gate insulation layer 230 on the semiconductor layer 240. That is, the first passivation layer 260 spaced apart from the gate insulation layer 230 by the semiconductor layer 240. Further, the first passivation layer 260 is formed at a location corresponding to a location of the gate electrode 220. That is, the first passivation layer 261 spaced apart from the gate electrode 220 by the gate insulation layer 230 and the semiconductor layer 240. The first passivation layer 260 may serve as an etch stopper layer (ESL). That is to say, the first passivation layer 260 prevents the semiconductor layer 240 from electrically deteriorating due to exposure of an interface of the semiconductor layer 240 to external air or moisture. The first passivation layer 260 may be made of silicon oxide ($SiO_x$). However, the present invention is not limited to such material. In addition, the first passivation layer 260 may be deposited on the semiconductor layer 240 by inductively coupled plasma-chemical vapor deposition (ICP-CVD). The ICP-CVD activates gas decomposition even at a low temperature by generating high density plasma. In addition, since the ICP-CVD employs remote plasma, a plasma generating zone and a substrate are spaced apart from each other, thereby reducing ion damages to a plasma-based film-growth zone. In addition, the ICP-CVD may be performed using $SiH_4$, $N_2O$ or He gas as a reaction gas. The forming of the first passivation layer (S250), that is, the ICP-CVD, may be performed at a processing temperature in a range of 120° C. to 170° C. If the processing temperature of the ICP-CVD in the forming of the first passivation layer (S250) is lower than 120° C., the first passivation layer 260 may not be deposited densely due to low temperature processing conditions and the reliability of the first passivation layer 260 may be deteriorated. If the processing temperature of the ICP-CVD in the forming of the first passivation layer (S250) is higher than 170° C., hydrogen may be induced to the IGZO semiconductor layer 240 due to high temperature deposition while depositing the first passivation layer 260 on the semiconductor layer 240. In such a case, the semiconductor layer 240 may have conductivity, which disables the semiconductor layer 240 to serve as a TFT. The ICP-CVD in the forming of the first passivation layer (S250) is preferably performed at a processing temperature of 150° C. When the forming of the second passivation layer (S270), which will later be described, is performed at a processing temperature of 300° C., the processing temperature of 150° C. may be the optimum temperature for the forming of the first passivation layer (S250), which will later be described with regard to an exemplary embodiment.

Figure 4F:
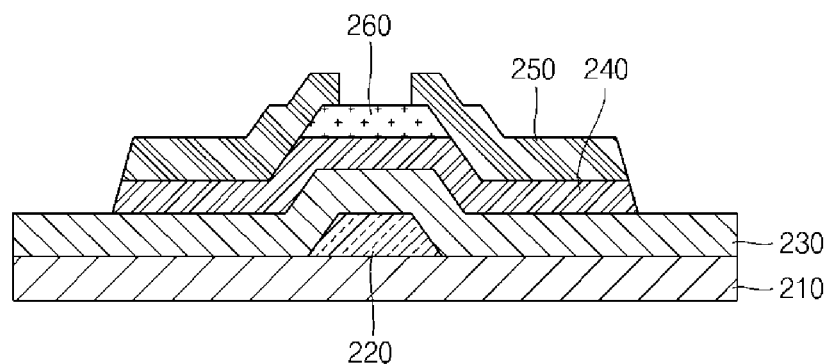

Referring to FIGS. 3 and 4F, in the forming of the source/drain electrodes (S260), source/drain electrodes 250 are formed on the semiconductor layer 240 and the first passivation layer 260 to expose a portion of a top portion of the first passivation layer 260 spaced apart from a top portion of the gate electrode 220.

Figure 4G:
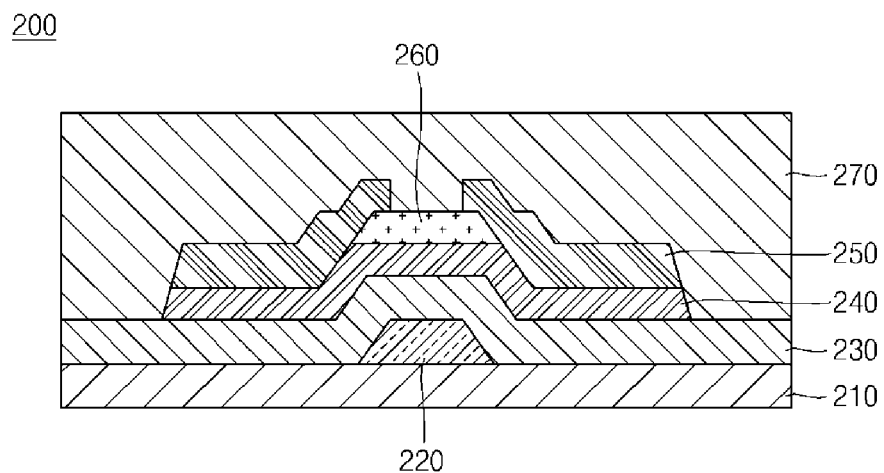

Referring to FIGS. 3 and 4G, in the forming of the second passivation layer (S270), a second passivation layer 270 is formed to cover exposed portions of the semiconductor layer 240, the source/drain electrode 250 and the first passivation layer 260. Prior to the forming of the second passivation layer 270, a passivation layer may further be formed to cover exposed portions of the semiconductor layer 240, the source/drain electrode 250 and the first passivation layer 260 under the same processing conditions as in the forming of the first passivation layer 260. However, the method for fabricating a TFT will be described below with regard to a case in which the second passivation layer 270 is directly formed without further forming a passivation layer. The second passivation layer 270 may be deposited on the first passivation layer 260 by ICP-CVD. In addition, the second passivation layer 270 may be deposited on the first passivation layer 260 by CVD or PVD. However, it is noted that the method for forming the second passivation layer 270 is not limited to the above mentioned methods. The second passivation layer 270 may be a single layer formed of at least one selected from the group consisting of a silicon oxide layer, a silicon nitride layer, a diamond like carbon (DLC) layer, and a silicon carbonaceous layer. However, the present invention is not limited to such materials. The forming of the second passivation layer (S270) may be performed at a processing temperature in a range of 280° C. to 320° C. If the processing temperature of the forming of the second passivation layer (S270) is lower than 280° C., the second passivation layer 270 may not be deposited densely. That is to say, the effect of improving the reliability of the TFT 100 by depositing the second passivation layer 270 at a higher temperature than the first passivation layer 260 may be reduced. If the processing temperature of the forming of the second passivation layer (S270) is higher than 320° C., the semiconductor layer 240 or the substrate 210 made of a flexible plastic material may be damaged due to a high temperature process. The forming of the second passivation layer (S270) is preferably performed at a processing temperature of 300° C. If the forming of the first passivation layer (S260) is performed at a processing temperature of 150° C., the forming of the second passivation layer (S270) may be performed at 300° C.

Hereinafter, output characteristics before and after reliability tests on OFF- and ON-condition of thin film transistors (TFTs) according to Example of the present invention and Comparative Examples will be described.

The TFTs according to Example of the present invention and Comparative Examples 1 and 2 were fabricated using the substrate, the gate insulation layer, the source/drain electrodes and the semiconductor layer shown in FIGS. 2A to 2D.

That is to say, a quartz-glass substrate is first provided, and a gate electrode made of chrome was then deposited on the quartz-glass substrate to a thickness of 100 nm using an evaporator. Then, the gate insulation layer was formed by depositing silicon oxide on the substrate and the gate electrode to a thickness of 310 nm by ICP-CVD. The semiconductor layer was deposited on the gate insulation layer to be located corresponding to the gate electrode. In detail, semiconductor layer was formed as anamorphous IGZO semiconductor layer by doping indium (In) and gallium (Ga) into a zinc oxide (ZnO) having a width of 100 μm and a channel length of 20 μm. Thereafter, the source/drain electrodes were formed by depositing indium tin oxide (ITO) on the gate insulation layer and the semiconductor layer to expose a predetermined portion of a top portion of the semiconductor layer using a sputter.

The TFTs according to Example of the present invention and Comparative Examples 1 and 2 were fabricated in substantially the same manner, except for processes of forming a passivation layer covering a gate insulation layer, source/drain electrodes and the semiconductor layer.

The processes of forming a passivation layer in Example of the present invention and Comparative Examples 1 and 2 will be described below in detail.

Example

Referring to FIGS. 1 and 2F, in the method for fabricating the TFT according to Example of the present invention, the first passivation layer was formed on the gate insulation layer, the source/drain electrodes and the semiconductor layer. The first passivation layer was deposited by ICP-CVD. The depositing of the first passivation layer was performed under processing conditions including a processing temperature of 150° C., RF power of 75 W, a composition ratio of reaction gases $SiH_4:N_2O:He$ being 30:5:100 [sccm], and a chamber pressure of 40 mTorr. In addition, the first passivation layer was deposited to a thickness of 150 nm.

Referring to FIGS. 1 and 2G, in the method for fabricating the TFT according to Example of the present invention, the second passivation layer was formed on the first passivation layer. The second passivation layer was deposited on the first passivation layer by ICP-CVD. The ICP-CVD was performed under the processing conditions including a processing temperature of 300° C., RF power of 75 W, a composition ratio of reaction gases $SiH_4:N_2O:He$ being 30:5:100 [sccm], and a chamber pressure of 40 mTorr. The second passivation layer was deposited on the first passivation layer to a thickness of 150 nm.

Comparative Example 1

In the TFT according to Comparative Example 1, a single passivation layer was formed on the gate insulation layer, the source/drain electrodes and the semiconductor layer. The passivation layer was deposited by ICP-CVD. The depositing of the passivation layer was performed under the processing conditions including a processing temperature of 150° C., RF power of 75 W, a composition ratio of reaction gases $SiH_4:N_2O:He$ being 30:5:100 [sccm], and a chamber pressure of 40 mTorr. In addition, the passivation layer was deposited to a thickness of 300 nm.

Comparative Example 2

In the TFT according to Comparative Example 2, a single passivation layer was formed on the gate insulation layer, the source/drain electrodes and the semiconductor layer. The passivation layer was deposited by ICP-CVD. The depositing of the passivation layer was performed under the processing conditions including a processing temperature of 300° C., RF power of 75 W, a composition ratio of reaction gases $SiH_4:N_2O:He$ being 30:5:100 [sccm], and a chamber pressure of 40 mTorr. In addition, the passivation layer was deposited to a thickness of 300 nm.

OFF-condition reliability tests are conducted in the following manner.

Output characteristics of TFTs according to Example of the present invention and Comparative Examples 1 and 2 before stress is applied thereto, that is, values of drain current $I_{DS}$ over a change in the drain voltage $V_{DS}$, were measured. Stress was applied to the TFTs according to Example of the present invention and Comparative Examples 1 and 2 by irradiating light of 5 mW/cm$^2$ was irradiated into the TFTs for 5000 seconds while the gate voltage $V_{GS}$ and the drain voltage $V_{DS}$ were maintained at −20 V and 0 V, respectively. Then, the output characteristics of the TFTs with stress applied thereto were measured. When the reliability tests were conducted on the TFTs according to Example of the present invention and Comparative Examples 1 and 2, the output characteristics of the TFTs were measured while varying the gate voltage VGS to 4 V, 6 V, and 8 V.

Figure 5A:
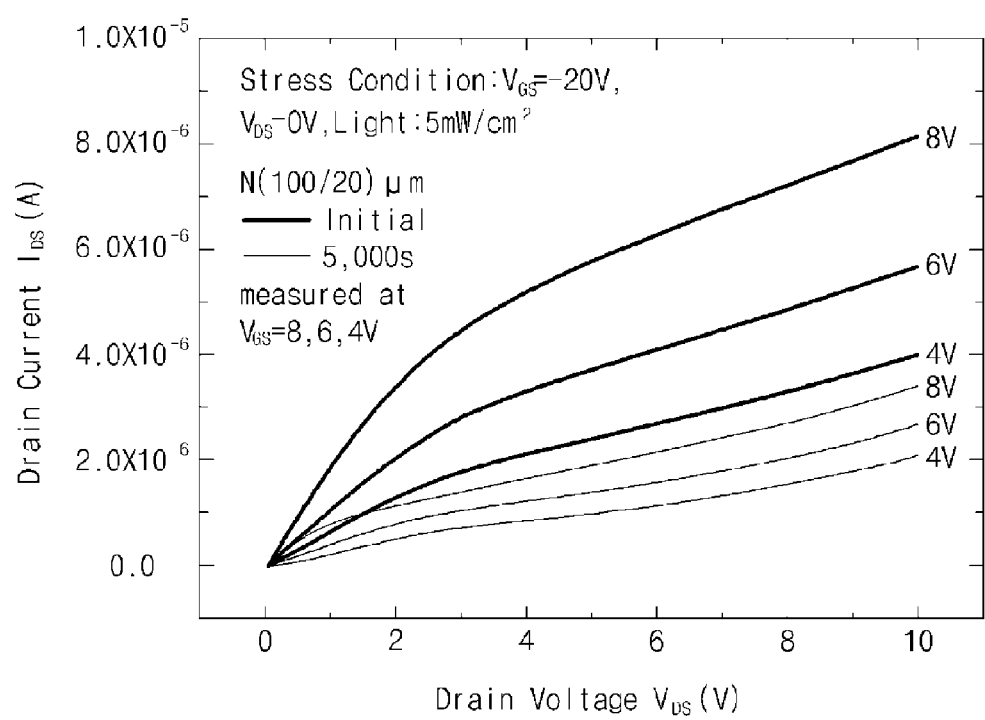
FIGS. 5A to 5C are graphs illustrating output characteristics before and after OFF-condition reliability tests of thin film transistors according to an embodiment of the present invention and a comparative example.
Figure 5B:
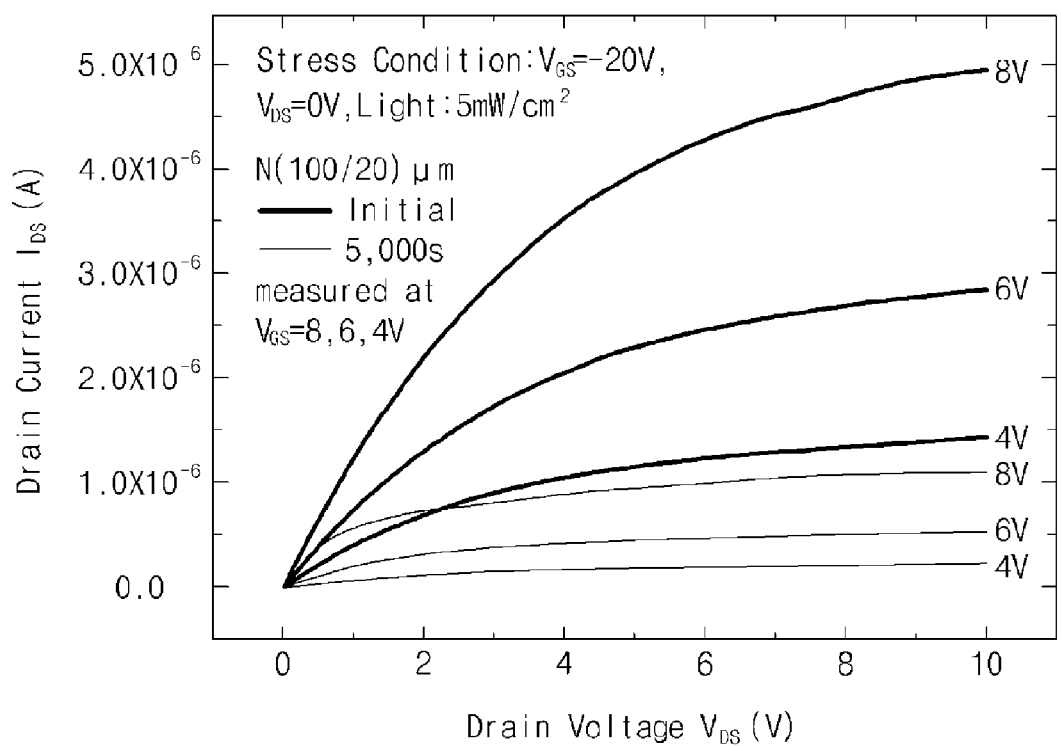
Figure 5C:
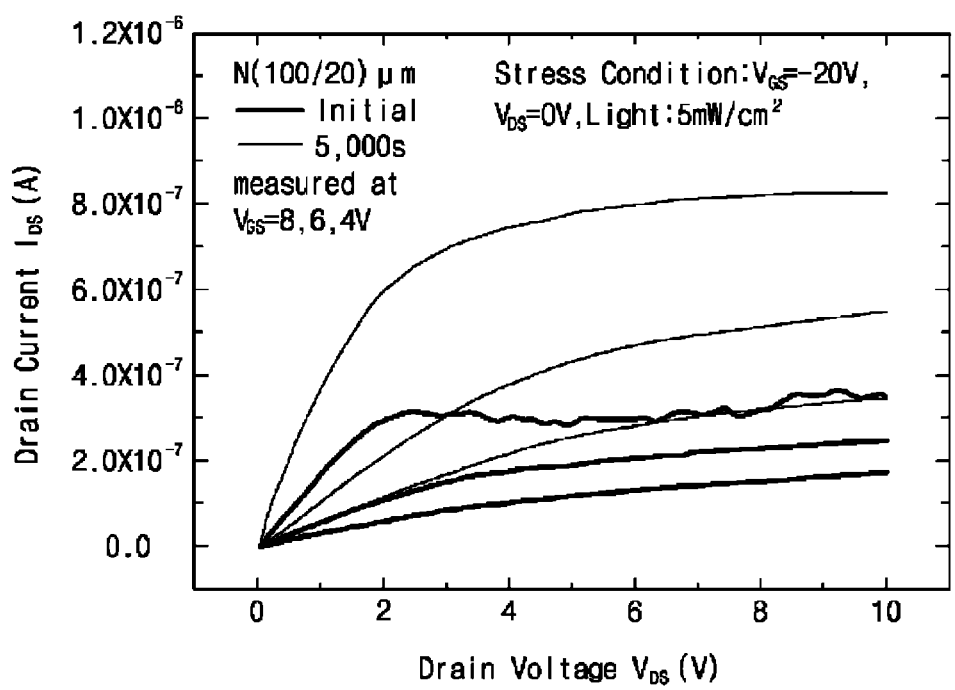

FIGS. 5A to 5C are graphs illustrating output characteristics before and after OFF-condition reliability tests of thin film transistors (TFTs) according to Example of the present invention and Comparative Examples.

In detail, FIG. 5A illustrates output characteristics of the TFT according to Example of the present invention before and after OFF-condition reliability tests, FIG. 5B illustrates output characteristics of the TFT according to Comparative Example 1 before and after OFF-condition reliability tests, and FIG. 5C illustrates output characteristics of the TFT according to Comparative Example 2 before and after OFF-condition reliability tests. In FIGS. 5A to 5C, the abscissa indicates the drain voltage $V_{DS}$ and the ordinate indicates the drain current $I_{DS}$. In addition, in FIGS. 5A to 5C, the graphs plotted by bold solid lines illustrate initial output characteristics of the TFTs before OFF-condition reliability tests, and the graphs plotted by thin solid lines illustrate output characteristics of the TFTs after OFF-condition reliability tests.

As confirmed from FIGS. 5A to 5C, when the TFTs according to Example of the present invention and Comparative Examples 1 and 2 were compared, the TFT according to Example of the present invention demonstrated the highest operation current level, that is, drain current, at the same gate and drain voltages. It was also confirmed that the TFT according to Example of the present invention experienced the smallest change in the drain current before and after stress was applied thereto. That is to say, it is understood that that the TFT according to Example of the present invention had highest reliability.

ON-condition reliability tests are conducted in the following manner.

Output characteristics of TFTs according to Example of the present invention and Comparative Examples 1 and 2 before stress is applied thereto, that is, values of drain current $I_{DS}$ over a change in the drain voltage $V_{DS}$, were measured. Stress was applied to the TFTs according to Example of the present invention and Comparative Examples 1 and 2 by irradiating light of 5 mW/cm$^2$ was irradiated into the TFTs for 5000 seconds while the gate voltage $V_{GS}$ and the drain voltage $V_{DS}$ were maintained at 20 V and 0 V, respectively. Then, the output characteristics of the TFTs with stress applied thereto were measured. When the reliability tests were conducted on the TFTs according to Example of the present invention and Comparative Examples 1 and 2, the output characteristics of the TFTs were measured while varying the gate voltage VGS to 4 V, 6 V, and 8 V.

Figure 6A:
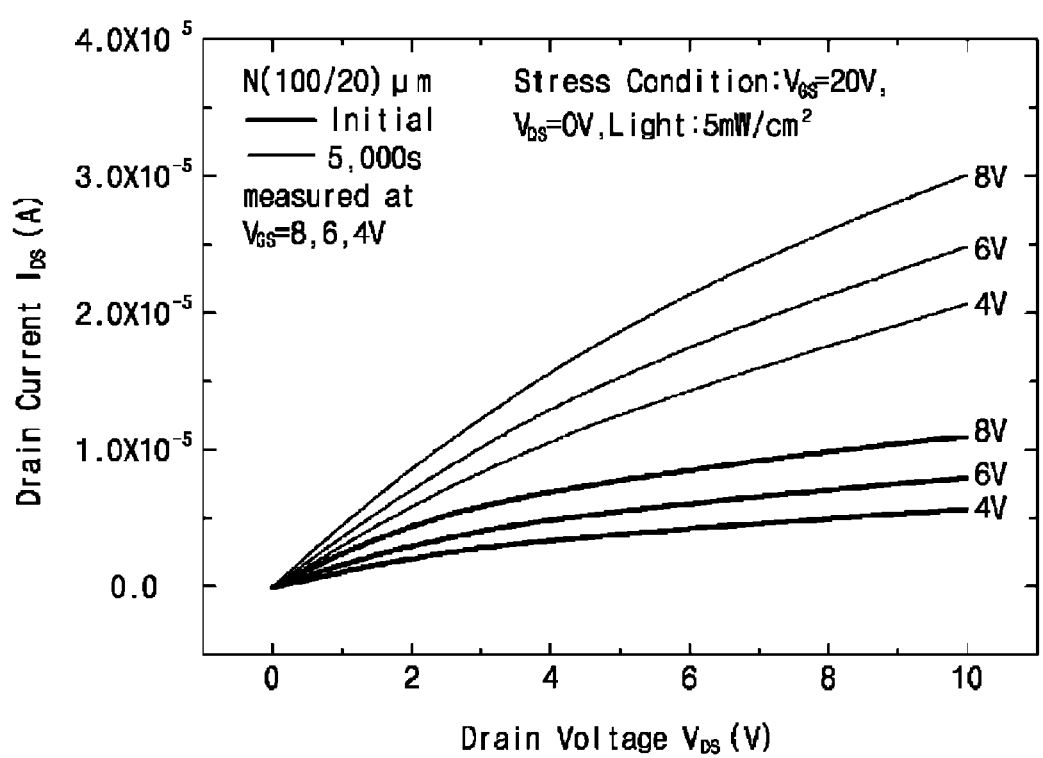
FIGS. 6A to 6C are graphs illustrating output characteristics before and after ON-condition reliability tests of thin film transistors according to an embodiment of the present invention and a comparative example.
Figure 6B:
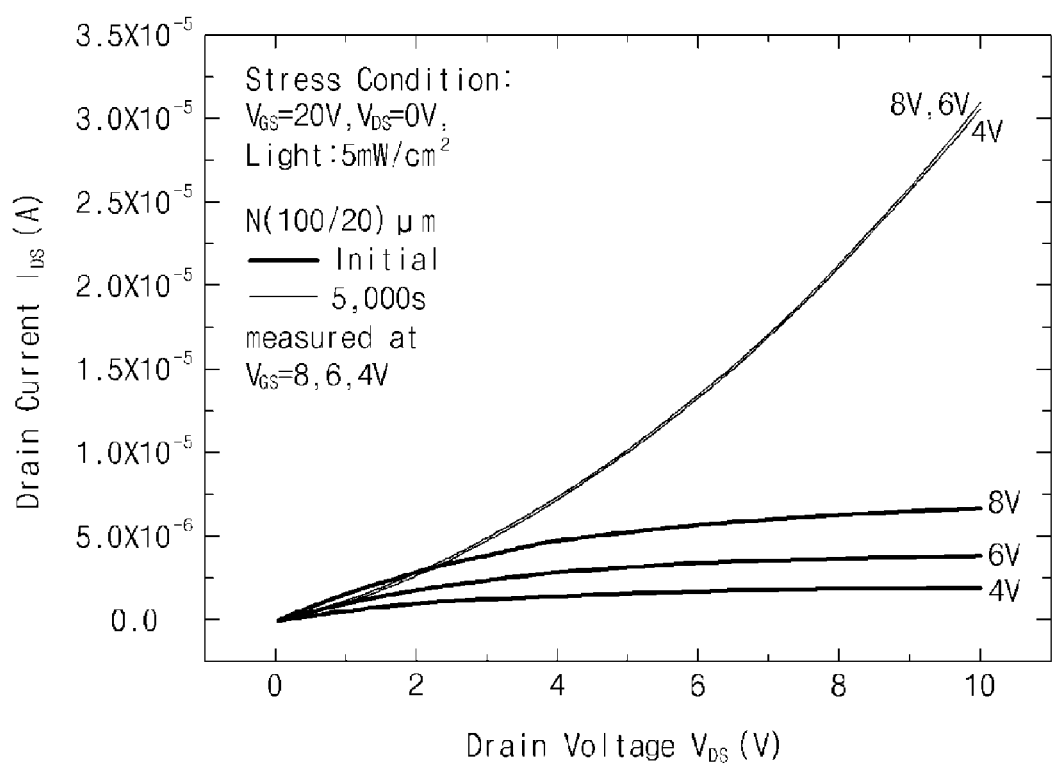
Figure 6C:
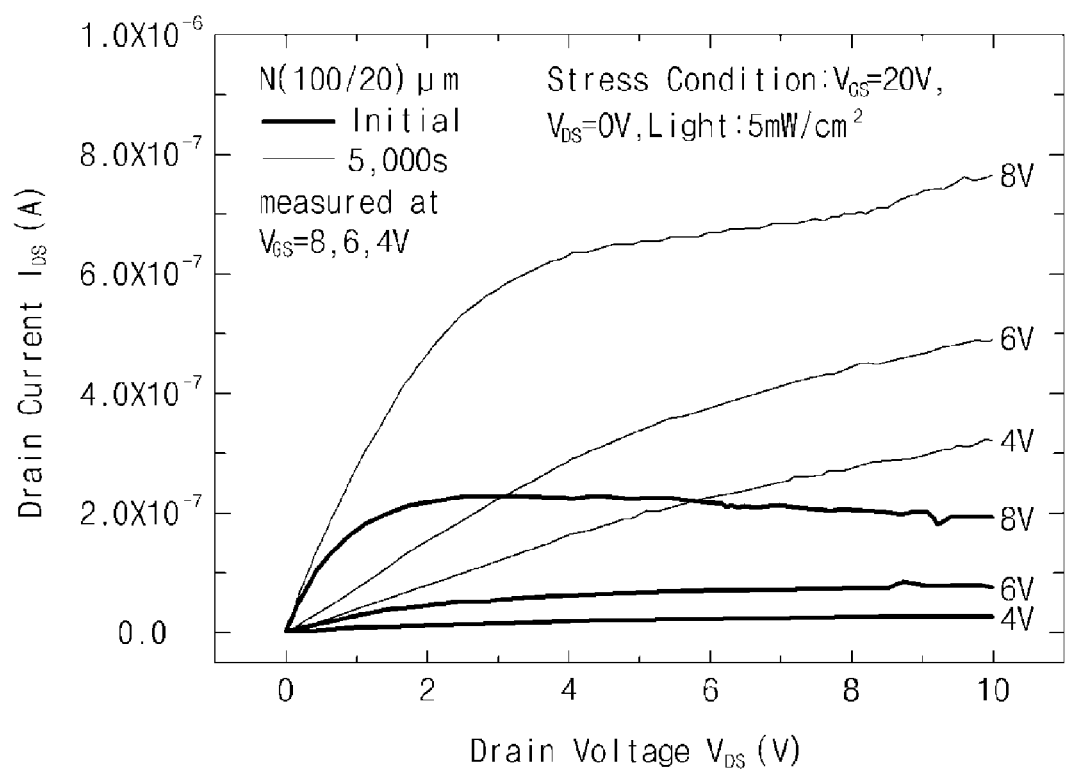

FIGS. 6A to 6C are graphs illustrating output characteristics before and after ON-condition reliability tests of thin film transistors according to Example of the present invention and Comparative Examples.

In detail, FIG. 6A illustrates output characteristics of the TFT according to Example of the present invention before and after ON-condition reliability tests, FIG. 6B illustrates output characteristics of the TFT according to Comparative Example 1 before and after ON-condition reliability tests, and FIG. 6C illustrates output characteristics of the TFT according to Comparative Example 2 before and after ON-condition reliability tests. In FIGS. 6A to 6C, the abscissa indicates the drain voltage $V_{DS}$ and the ordinate indicates the drain current $I_{DS}$. In addition, in FIGS. 6A to 6C, the graphs plotted by bold solid lines illustrate initial output characteristics of the TFTs before ON-condition reliability tests, and the graphs plotted by thin solid lines illustrate output characteristics of the TFTs after ON-condition reliability tests.

As confirmed from FIGS. 6A to 6C, when the TFTs according to Example of the present invention and Comparative Examples 1 and 2 were compared, the TFT according to Example of the present invention demonstrated the highest operation current level, that is, drain current, at the same gate and drain voltages. It was also confirmed that the TFT according to Example of the present invention experienced the smallest change in the drain current before and after stress was applied thereto. That is to say, it is understood that that the TFT according to Example of the present invention had highest reliability.

Hereinafter, comparative analysis of silicon oxide ($SiO_x$) samples prepared in Test Example and Comparative Example by Fourier-transform infrared spectroscopy (FT-IR) will be described.

Figure 7A:
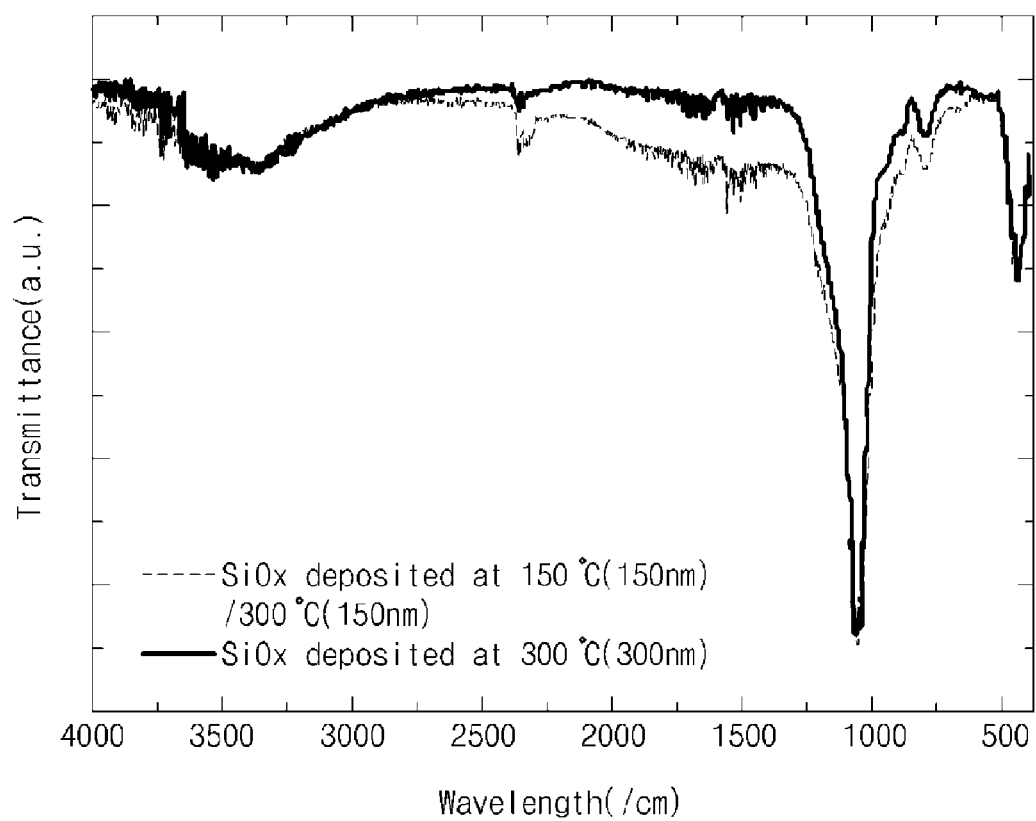
FIGS. 7A and 7B are graphs illustrating comparison results of silicon oxide samples prepared in Test Example of the present invention and Comparative Example, as analyzed by FT-IR.
Figure 7B:
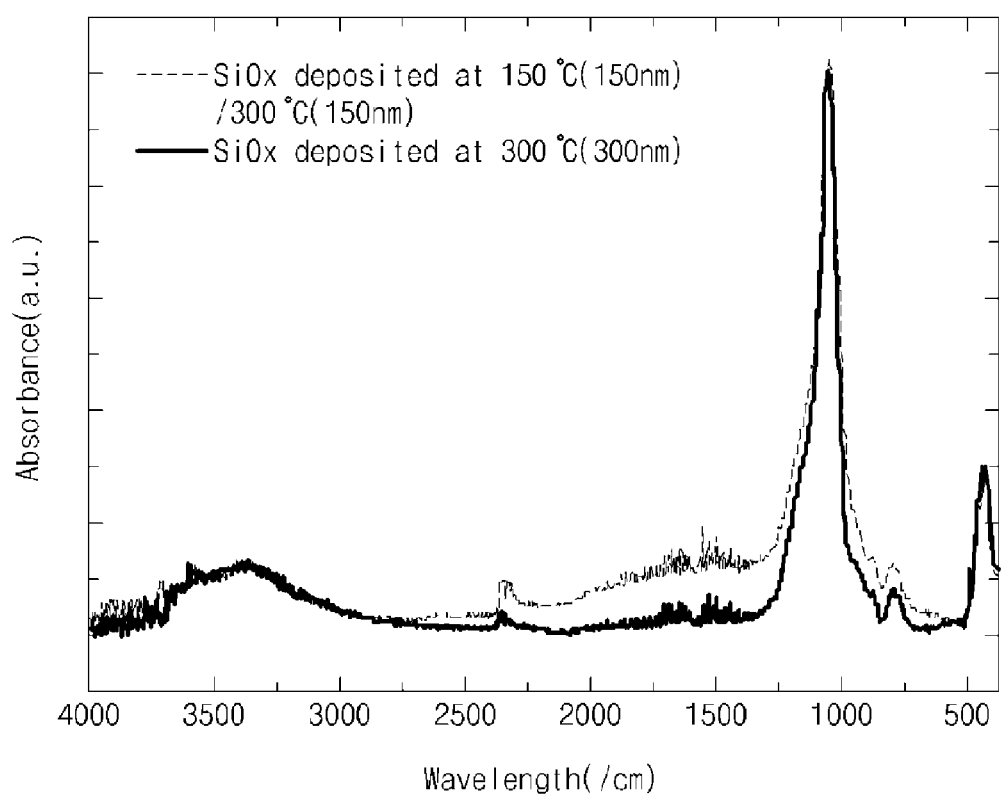

FIGS. 7A and 7B are graphs illustrating comparison results of silicon oxide samples prepared in Test Example of the present invention and Comparative Example, as analyzed by FT-IR.

The silicon oxide ($SiO_x$) samples according to Test Example and Comparative Example are prepared in the following manner.

Test Example

A 150 nm thick silicon oxide sample was formed by ICP-CVD under processing conditions of RF power of 75 W, a reaction gas composition ratio of $[N_2O]/[SiH_4]=6$, a chamber pressure of 40 mTorr, and a processing temperature of 150° C. Then, a 150 nm thick silicon oxide sample was further formed by ICP-CVD under processing conditions of RF power of 75 W, a reaction gas composition ratio of $[N_2O]/[SiH_4]=6$, a chamber pressure of 40 mTorr, and a processing temperature of 300° C., yielding the silicon oxide sample according to Test Example.

Comparative Example 3

A 300 nm thick silicon oxide sample according to Comparative Example 3 was formed by ICP-CVD under processing conditions of RF power of 75 W, a reaction gas composition ratio of $[N_2O]/[SiH_4]=6$, a chamber pressure of 40 mTorr, and a processing temperature of 300° C.

In FIG. 7A, the abscissa indicates the wavelength ($cm^{-1}$) and the ordinate indicates the transmittance (a.u.). In addition, in FIG. 7A, the graph plotted by a dotted lines illustrates the transmittance relative to the wavelength of the silicon oxide sample according to Test Example, and the graph plotted by a solid line illustrates the transmittance relative to the wavelength of the silicon oxide sample according to Comparative Example 3. In FIG. 7B, the abscissa indicates the wavelength ($cm^{-1}$) and the ordinate indicates the absorbance (a.u.). In addition, in FIG. 7B, the graph plotted by a dotted lines illustrates the absorbance relative to the wavelength of the silicon oxide sample according to Test Example, and the graph plotted by a solid line illustrates the absorbance relative to the wavelength of the silicon oxide sample according to Comparative Example 3.

Referring to FIG. 7A, the silicon oxide sample of Test Example generally had lower transmittance than the silicon oxide sample of Comparative Example 3. Referring to FIG. 7B, the silicon oxide sample of Test Example generally had higher absorbance than the silicon oxide sample of Comparative Example 3. This suggests that the silicon oxide sample formed of a single layer at 300° C., which is a relatively high temperature, has a higher concentration of hydrogen than the silicon oxide sample formed of double layers respectively formed at 150° C. and 300° C. Therefore, in a case where a first passivation layer is formed at a relatively low temperature and a second passivation layer is formed on the first passivation layer at a relatively high temperature, induction of hydrogen into the TFT was effectively suppressed compared to a case where a single passivation layer is formed at a relatively high temperature.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method for fabricating a thin film transistor, comprising:
    providing an insulating substrate;
    forming a gate electrode on the substrate;
    forming a gate insulation layer on the substrate and the gate electrode;
    forming a semiconductor layer on the gate insulation layer;
    forming source/drain electrodes on the semiconductor layer to only expose a portion of a top portion of the semiconductor layer;
    forming a first passivation layer to cover exposed top portions of the gate insulation layer, the semiconductor layer and the source/drain electrodes, wherein the first passivation layer is not a conformal shape, such that the first passivation layer has a planar top surface; and
    forming a second passivation layer on the first passivation layer, wherein the forming of the second passivation layer comprises performing deposition at a higher temperature than the forming of the first passivation layer.

2. The method of claim 1, wherein the semiconductor layer is an amorphous IGZO semiconductor layer formed by doping indium (In) and gallium (Ga) into a zinc oxide (ZnO).

3. The method of claim 2, wherein the forming of the first passivation layer comprises depositing the first passivation layer by inductively coupled plasma-chemical vapor deposition (ICP-CVD).

4. The method of claim 2, wherein the forming of the second passivation layer comprises depositing the second passivation layer by inductively coupled plasma-chemical vapor deposition (ICP-CVD).

5. The method of claim 3, wherein the forming of the first passivation layer is performed at a processing temperature in a range of 120° C. to 170° C.

6. The method of claim 3, wherein the forming of the first passivation layer is performed at a processing temperature of 150° C.

7. The method of claim 5, wherein the forming of the second passivation layer is performed at a processing temperature in a range of 280° C. to 320° C.

8. The method of claim 5, wherein the forming of the second passivation layer is performed at a processing temperature of 300° C.

9. A method for fabricating a thin film transistor, comprising:
providing an insulation substrate;
forming a gate electrode on the substrate;
forming a gate insulation layer on the substrate and the gate electrode;
forming a semiconductor layer on the gate insulation layer;
forming a first passivation layer on the semiconductor layer to be located corresponding to the gate insulation layer;
forming source/drain electrodes on the semiconductor layer and the gate insulation layer to expose a portion of a top portion of the first passivation layer; and
forming a second passivation layer to completely and directly cover exposed portions of the gate insulation layer, the semiconductor layer, the source/drain electrodes and the first passivation layer, wherein the forming of the second passivation layer comprises performing deposition at a higher temperature than the forming of the first passivation layer and the second passivation layer is not a conformal shape, such that the second passivation layer has a planar top surface.

10. The method of claim 9, wherein the semiconductor layer is an amorphous IGZO semiconductor layer formed by doping indium (In) and gallium (Ga) into a zinc oxide (ZnO).

11. The method of claim 10, wherein the forming of the first passivation layer comprises depositing the first passivation layer by inductively coupled plasma-chemical vapor deposition (ICP-CVD).

12. The method of claim 10, wherein the forming of the second passivation layer comprises depositing the second passivation layer by inductively coupled plasma-chemical vapor deposition (ICP-CVD).

13. The method of claim 11, wherein the forming of the first passivation layer is performed at a processing temperature in a range of 120° C. to 170° C.

14. The method of claim 11, wherein the forming of the first passivation layer is performed at a processing temperature of 150° C.

15. The method of claim 13, wherein the forming of the second passivation layer is performed at a processing temperature in a range of 280° C. to 320° C.

16. The method of claim 13, wherein the forming of the second passivation layer is performed at a processing temperature of 300° C.

17. A thin film transistor comprising:
a substrate made of an insulating material;
a gate electrode formed on the substrate;
a gate insulation layer formed on the substrate and the gate electrode;
a semiconductor layer formed on the gate insulation layer to be located corresponding to the gate electrode;
source/drain electrodes formed to only expose a portion of a top portion of the semiconductor layer;
a first passivation layer to cover exposed portions of the gate insulation layer, the semiconductor layer and the source/drain electrodes, wherein the first passivation layer is not a conformal shape, such that the first passivation layer has a planar top surface; and
a second passivation layer formed to cover a top portion of the first passivation layer, wherein the second passivation layer is formed by deposition performed at a higher temperature than the first passivation layer.

18. The thin film transistor of claim 17, wherein the semiconductor layer is an amorphous IGZO semiconductor layer formed by doping indium (In) and gallium (Ga) into a zinc oxide (ZnO).

19. A thin film transistor comprising:
a substrate made of an insulating material;
a gate electrode formed on the substrate;
a gate insulation layer formed on the substrate and the gate electrode;
a semiconductor layer formed on the gate insulation layer to be located corresponding to the gate electrode;
a first passivation layer formed on the semiconductor layer to be located corresponding to the gate insulation layer;
source/drain electrodes formed to expose a portion of a top portion of the first passivation layer; and
a second passivation layer formed to completely and directly cover exposed portions of the gate insulation layer, the semiconductor layer, the source/drain electrodes and the first passivation layer, wherein the second passivation layer is formed by deposition performed at a higher temperature than the first passivation layer and the second passivation layer is not a conformal shape, such that the second passivation layer has a planar top surface.

20. The thin film transistor of claim 19, wherein the semiconductor layer is an amorphous IGZO semiconductor layer formed by doping indium (In) and gallium (Ga) into a zinc oxide (ZnO).

* * * * *